United States Patent [19]

Takizawa et al.

[11] Patent Number: 5,429,983
[45] Date of Patent: Jul. 4, 1995

[54] METHOD OF MANUFACTURING SEMICONDUCTOR DEVICE

[75] Inventors: Yutaka Takizawa; Ken-ichi Yanai, both of Kawasaki, Japan

[73] Assignee: Fujitsu Limited, Kawasaki, Japan

[21] Appl. No.: 297,155

[22] Filed: Aug. 29, 1994

[30] Foreign Application Priority Data

Dec. 27, 1993 [JP] Japan .................................. 5-330661
Mar. 18, 1994 [JP] Japan .................................. 6-049528

[51] Int. Cl.⁶ ............................................. H01L 21/20
[52] U.S. Cl. .................................... 437/132; 437/111; 437/89; 117/105
[58] Field of Search .................... 148/33.3, 33.4, 33.5, 148/33.6; 437/2, 3, 4, 5, 132, 111, 89; 117/105

[56] References Cited

U.S. PATENT DOCUMENTS

| | | | |
|---|---|---|---|
| 4,876,218 | 10/1989 | Pessa et al. | 437/132 |
| 5,134,091 | 7/1992 | Chikyou et al. | 437/111 |
| 5,141,893 | 8/1992 | Ito et al. | 437/111 |
| 5,229,332 | 7/1993 | Cho | 117/105 |
| 5,242,530 | 9/1993 | Batey et al. | |
| 5,242,580 | 9/1993 | Batey et al. | 437/89 |

FOREIGN PATENT DOCUMENTS 57-193025 11/1982 Japan .
58-120595 7/1983 Japan .
61-174196 8/1986 Japan .
62-96667 5/1987 Japan .

OTHER PUBLICATIONS

Chourasa et al. in Nature, vol. 249, May 1974, pp. 28–29, in "Ultra thin conducting films of gold on platinum nucleating layers".
G. N. Parsons, Applied Physics Letter 59, IBM Research Division, New York, Aug. 16, 1991, pp. 2546–2548.

Primary Examiner—R. Bruce Breneman
Assistant Examiner—Ramamohan Rao Paladugu
Attorney, Agent, or Firm—Armstrong, Westerman, Hattori, McLeland & Naughton

[57] ABSTRACT

A method of manufacturing a semiconductor device according to the present invention comprises the steps of forming a conductive film on an insulating film, forming growth nucleuses containing any of elements in group IIIb, group IVb, group Vb and group VIIb that does not constitute the conductive film and the insulating film on the surface of the conductive film, and growing a semiconductor selectively on growth nucleuses.

18 Claims, 19 Drawing Sheets

<Specimen A>

<Specimen B>

<Specimen C>

(PRESENT INVENTION)

METHOD OF MANUFACTURING SEMICONDUCTOR DEVICE

BACKGROUND OF THE INVENTION

1. Field of the Invention

The present invention relates to a method of preventing deterioration of film quality of a transparent conductive film, a semiconductor device and the method of manufacturing a semiconductor device.

2. Description of the Related Art

A portable information processor is indispensable for performing electronic data processing (EDP) on an individual level, and a liquid crystal display unit is used as man-machine interface required for realizing EDP. It is desired for an image display unit to realize display of high density and high color rendering capable of performing more advanced information processing of image processing or the like at a low cost.

An active matrix type liquid crystal display unit has a construction in which switching elements are connected to all of a plurality of display units called picture elements, thus making high grade display possible. A semiconductor element such as a diode and a transistor is used as the switching element.

The characteristic of the switching element is required to be excellent since it is one of the primary factors for determining the number of gradation and the display capacity of the liquid crystal display unit. Further, since these switching elements are manufactured through a complicated process accompanied by fine processing, the process thereof controls simplification of the process for the whole liquid crystal display unit.

As a means for simplifying the manufacturing process of the switching element, it is being considered to form a new pattern on the pattern already formed on a substrate in the self align manner. There is a technique for growing a thin film selectively only on a conductive pattern as one of processes adopting such a line of thinking of self alignment.

Since it is possible in selective growth to form a layer selectively only on a thin film applied with patterning on a substrate, a photolithography process becomes unnecessary. Further, since it is possible to grow still another thin film continuously without breaking vacuum after the selective forming process, contamination on interlayer interfaces is little, and the switching element characteristic is improved.

Now, in a plurality of selective growth techniques that have been heretofore developed, a chemical vapor deposition (CVD) method is utilized so as to achieve selective growth by the difference in chemical property of layer surfaces.

The CVD method is used frequently as a growth method of a semiconductor or a metal, but the growth rate is not controlled normally under such a condition that reflects the chemical disposition of the layer surface. Therefore, selective deposition of a film does not appear normally. However, it has become possible to perform selective growth by reducing a deposition rate by diluting growth gas with another gas or by having the chemical disposition of the layer surface reflected by bringing etching and deposition close to an equilibrium state.

As a technique of selective growth of silicon, there is an epitaxial lateral overgrowth (ELO) method disclosed in Japanese Patent Provisional Publication No. SHO58-120595 for instance. This is a method of expanding a margin of a selective growth of silicon by repeating deposition and etching of layers alternately for a substrate having a region where silicon is grown and a region where silicon is difficult to be grown.

It has been disclosed in U.S. Pat. No. 5,242,530 that this technique is also applicable to a plasma CVD method widely used in the manufacture of a solar cell and an active matrix type liquid crystal display unit.

The feature of these techniques is to repeat etching and deposition alternately by utilizing a slight difference in a silicon growth rate produced by the difference between materials forming the layers.

However, as the chemical state of the surface of the layer depends on the layer constituting material, growth had to be performed under a condition of a very narrow margin in order to achieve selective silicon growth between materials having closely resembling chemical dispositions.

Accordingly, when the film forming rate is increased in order to shorten the process period of time, it gets out of the condition of selective growth. Thus, such a problem that the film forming process has to be performed for a long period of time by slowing down the film forming rate for performing selective growth has been caused.

It is inevitable to increase the percentage of etching occupying in the total process period of time for surely removing the silicon film deposited in disused parts in order to make selective growth uniform in an active matrix having a large area. As a result, the effective film deposition period of time is reduced and the total selective growth process period of time gets longer, thus producing a main cause of deteriorating the productivity.

Further, it depends on the material constituting the surface of the layer where the film is grown whether silicon is grown or not. Furthermore, the state of the layer surface is also changed by contamination and natural oxidation. Therefore, when the technique of selective growth is examined practically from a viewpoint of a manufacturing process, it has more or less lacked practicability.

For example, ITO shows a disposition of a electrically degenerated semiconductor and functions as an electrode, but resembles in a chemical disposition to silicon oxide that is an oxide such as quartz and glass constituting the substrate since ITO is an oxide, and there is little difference in the processes that silicon is grown on ITO and the substrate. Further, the reducing gas used when silicon is grown selectively on the surface of the transparent conductive film deteriorates the surface of the transparent conductive film.

Accordingly, it is difficult to perform selective growth on either one of two films having resembling chemical dispositions. Practically, according to the examination of the present inventor, it has been found that the reproducibility of selective growth is poor, and such results are brought about that non-selective deposition of silicon films is produced frequently and the silicon film is deposited on the quartz substrate only.

SUMMARY OF THE INVENTION

It is an object of the present invention to provide a method of preventing deterioration of a surface of a transparent conductive film, and also to provide a method of manufacturing a semiconductor device capable of selectively growing a semiconductor easily on the transparent conductive film.

According to the present invention, on a surface of a conductive film that becomes a substrate for selective growth, growth nucleuses containing any element of group IIIb, group IVb, group Vb and group VIIb that does not form that conductive film and insulating layers therearound is formed, and a semiconductor is grown selectively thereon.

With this, a semiconductor layer is selectively grown easily by varying chemical disposition of the surface of the conductive film and the insulating layer therearound.

Further, according to the present invention, a layer containing an element of group Vb is formed by having at least the element of group Vb contained in the surface of the transparent conductive film composed of an oxide.

When the transparent conductive film containing oxygen is placed in the reducing atmosphere, the reduction of the transparent conductive film is controlled by the layer containing the element of group Vb, deterioration of the film quality of the transparent conductive film does not get worse, and conductivity and transparency become more difficult to be lowered. These facts have been confirmed through experiments.

This layer containing an element of group Vb is formed in a self align manner by means of replacement of oxygen with the element of group Vb on the surface of the transparent conductive film by placing the transparent conductive film in the active atmosphere containing the element of group Vb. As a result, it becomes unnecessary to adopt special processing technique or patterning technique. For example, this layer containing an element of group Vb is formed simply as the processing prior to grow a semiconductor selectively on the transparent conductive film.

When the layer containing an element of group Vb is formed in the active atmosphere at a temperature of 200° C. or higher, an elimination reaction of oxygen from the transparent conductive film containing oxygen occurs principally, and the layer containing the element of group Vb becomes more difficult to be formed on the layer. Therefore, it is required to set the temperature to 200° C. or below. In particular, room temperature is desirable in order to make the vapor pressure of the element of group Vb lower.

DESCRIPTION OF THE PREFERRED EMBODIMENTS

The First Embodiment

FIGS. 1A to 1D are sectional views showing a process of selective growth in an embodiment of the present invention.

Figure 1A:
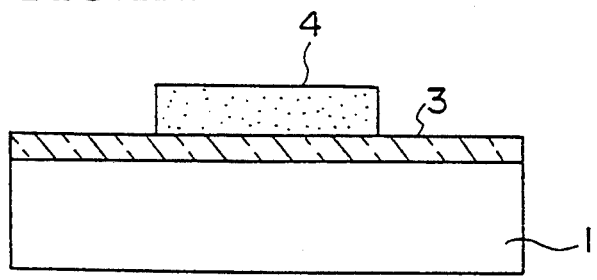
FIG. 1A to FIG. 1E are sectional views showing a selective growth method according to a first embodiment of the present invention.

First, as shown in FIG. 1A, a transparent conductive film 3 composed of a metallic oxide is formed by DC sputtering on a transparent insulating substrate 1 composed of glass, quartz or the like. Then, photoresist 4 is applied thereto, which is exposed and developed so as to form a pattern. An indium oxide film added with tin (ITO: Indium Tin Oxide) is available for instance as the metallic oxide.

Figure 1B:
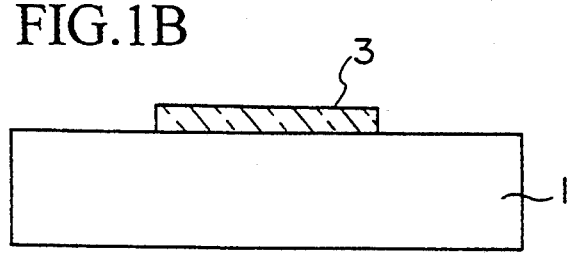

Next, as shown in FIG. 1B, the transparent conductive film 3 is applied with patterning with the photoresist 4 as a mask by photolithography technique. After patterning is completed, the photoresist 4 is removed.

Thereafter, the insulating substrate 1 is placed in an active atmosphere containing an element in group IIIb, group IVb or group Vb of the periodic table (IUPAC, provisional declaration in 1972), and the element is stuck to and introduced in the surface of the transparent conductive film 3. An atmosphere containing $NH_3$ or $PH_3$ formed into plasma is available for instance as the active atmosphere.

Figure 1C:
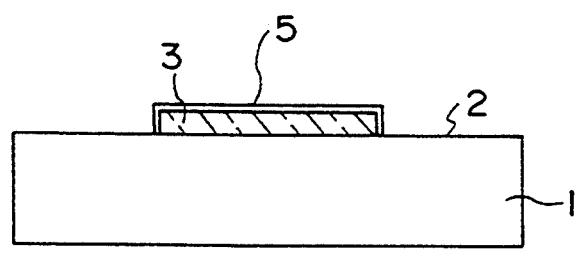

With this, growth nucleuses (growth seeds) 5 composed of a metallic oxide containing an element in group IIIb, group IVb or group Vb is formed on the surface thereof as shown in FIG. 1C. The growth nucleuses may make a thin layer. The growth nucleuses Since this growth nucleus layer is formed in a self align manner only on the surface of the transparent conductive film 3, it is not required to adopt special working technique or patterning technique.

Figure 1D:
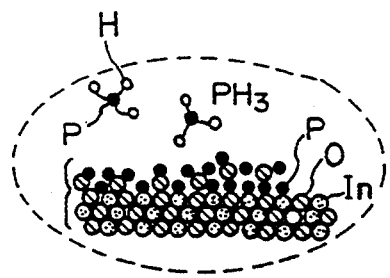
Figure 1E:
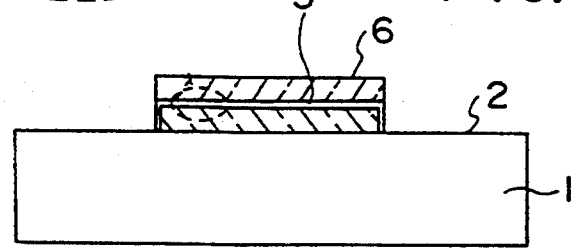

Thereafter, as shown in FIG. 1D, an amorphous semiconductor film 6 is grown selectively on the transparent conductive film 3 covered with the growth nucleus layer 5 using a CVD method.

Now, a silicon film has been grown selectively only on an ITO film under the following conditions by using the ITO film as the transparent conductive film 3 and a quartz substrate as the insulating substrate 1.

First, the insulating substrate 1 is placed in a chamber (not illustrated) of a parallel-plate electrode type plasma CVD apparatus from the state shown in FIG. 1B. Then, while maintaining the inside of the chamber at 1.0 Torr, phosphine ($PH_3$) gas (concentration: 0.5 at. %) diluted with hydrogen is introduced into the chamber, and a radio frequency (RF) power source of 13.56 MHz and 300 W is connected between electrodes surrounding the insulating substrate 1 while maintaining the substrate temperature at 200° C. or below, preferably at room temperature. By placing the insulating substrate 1 in the phosphine plasma atmosphere for 20 minutes under such conditions as described above, the surface of the transparent conductive film 3 that is an oxide is reformed so as to contain phosphorus (P) and the growth nucleus layer 5 is formed on the surface of the transparent conductive film 3.

Figure 2:
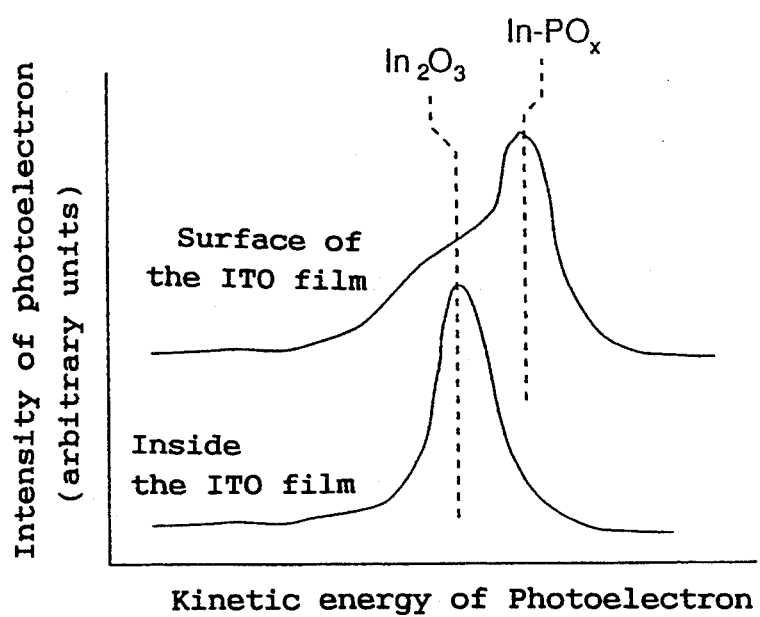
FIG. 2 is an element distribution diagram on a surface and inside of a conductive film applied to the first embodiment of the present invention.

The result obtained by analyzing the chemical state of the surface of the transparent conductive film 3 composed of ITO applied with phosphine plasma processing by electron spectroscopy for chemical analysis (ESCA) is shown in FIG. 2.

Indium oxygen ($In_2O_3$) is the principal ingredient inside the ITO film, but indium phosphorus oxide (In—$PO_x$) is the principal ingredient in the surface of the ITO film, which shows that the chemical state of the surface is different.

After the growth nucleus layer 5 is formed as described above, when the substrate temperature is changed to 100° to 200° C., hydrogen is introduced so as to set the pressure in the chamber to 0.6 Torr, an RF power source of 13.56 MHz and 400 W is connected between electrodes so as to make preparations for plasma generating conditions, and the operation of introducing mixed gas of silane ($SiH_4$) and $PH_3$ into the chamber for several seconds once in several ten seconds is repeated approximately 100 times, silicon (a semiconductor layer 6) has been grown on the transparent conductive film 3 composed of ITO. Besides, $PH_3$ introduced in this process is used to form the semiconductor layer 6 into an n type. Hydrogen acts as etching gas independently.

Now, ITO shows a disposition of an electrically degenerated semiconductor. Since ITO is an oxide, however, it resembles in chemical disposition to quartz or glass constituting the insulating substrate 1, i.e., silicon oxide that is an oxide, and, in the selective growth by a conventional method, when the region of ITO and the region of quartz are compared with each other, the deposition process of silicon in these regions differs little. Practically, according to the experiments of the inventor et al., the reproducibility of selective growth is poor, thus resulting in that non-selective deposition of the silicon film is produced frequently, and the silicon film is deposited only on the quartz substrate sometimes.

As against the above, according to the present embodiment, when the insulating substrate 1 and the transparent conductive film 3 are compared with each other, it has been confirmed that silicon can be grown selectively with high reproducibility since the chemical states of the surfaces thereof are largely different from each other. When an unprocessed substrate is used, reproducibility of selective growth of silicon is not very high.

Besides, the chemical disposition of the surface of the transparent conductive film has been reformed by placing the transparent conductive film in the plasma atmosphere in the above description. However, the reforming method is not limited thereto, but the growth nucleuses may also be formed in the surface layer of the transparent conductive film by a chemical reaction by thermal excitation or a photochemical reaction. Further, ammonia (NH3) gas or gas containing an element in group IIIb, group IVb, group Vb, group VIb or group VIIb that does not constitute the transparent conductive film and the insulating substrate may be adopted as the gas for reforming the surface of the transparent conductive film, and any gas capable of changing the chemical disposition of the surface of the insulating substrate may be used. Besides, when the surface of the ITO film is reformed by NH3 gas, a transparent indium nitride layer is formed on the surface thereof.

As described above, since the element in group IIIb, group IVb, group Vb, group VIb or group VIIb is stable in coupling with silicon and germanium, the growth nucleus layer 5 has a selective growth accelerating function, and silicon or germanium grows selectively and sufficiently on the transparent conductive film on the insulating substrate 1. As a result, it is expected that the present invention will be applied to an active matrix type liquid crystal display unit and a solar cell element.

Now, the growth nucleus layer formed on the surface of the transparent conductive film is also provided with a function to protect the transparent conductive film against reduction by hydrogen plasma or the like in the case of selective growth of silicon. Thereupon, a reduction-resistant growth nucleus layer will be described in detail as a second embodiment.

The Second Embodiment

FIG. 3 to FIG. 6 are sectional views showing a process of preventing deterioration of film quality of a transparent conductive film according to a second embodiment of the present invention.

Figure 3:
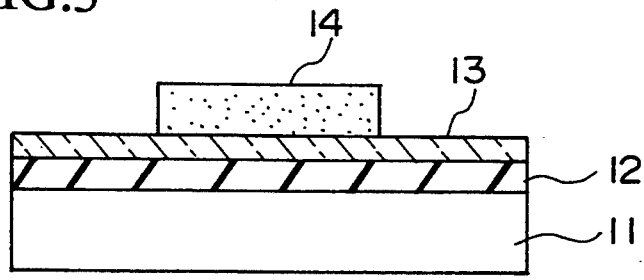
FIG. 3 to FIG. 6 are sectional views showing a processing process for preventing deterioration of film quality of a transparent conductive film according to a second embodiment of the present invention.

First, as shown in FIG. 3, an insulating film 12 is formed on a transparent insulating substrate 11 composed of glass, quartz or the like, and a transparent conductive film 13 composed of a metallic oxide such as ITO is formed thereon by DC sputtering.

Figure 4:
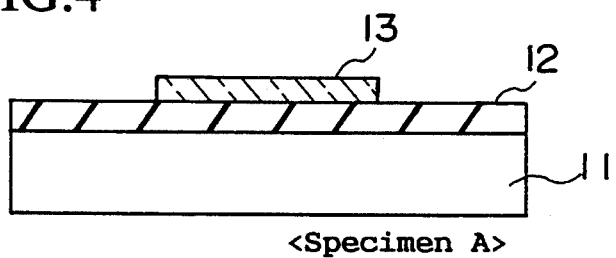

Next, photoresist 14 is applied and is exposed and developed thereby to form a pattern. Then, as shown in FIG. 4, the transparent conductive film 13 is applied with patterning by photolithography technique with the photoresist 14 as a mask. The photoresist 14 is removed after patterning is completed.

Thereafter, when an active atmosphere containing an element in group Vb of the periodic table (IUPAC, provisional declaration in 1972) is generated around the transparent conductive film 13 and the element is made to stick to the surface of the transparent conductive film 13, the growth nucleuses 15 composed of a metallic oxide containing an element in group Vb is formed on the surface. Since this growth nucleus layer is formed in a self aligning manner only on the surface of the transparent conductive film 13, it is not required to use special processing technique or patterning technique.

Figure 6:
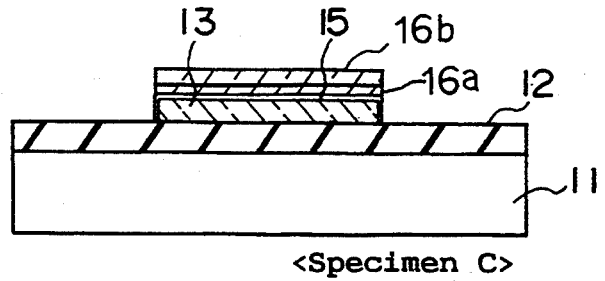

Thereafter, an amorphous semiconductor film 16 is grown on the transparent conductive film 13 covered with the growth nucleus layer 15 by a CVD method as shown in FIG. 6.

Even if a reduction atmosphere is in existence around the transparent conductive film 13 when this semiconductor film 16 is grown, the growth nucleus layer 15 containing an element in group Vb is hard to be reduced, thus preventing deterioration of the transparent conductive film 13. Further, the transparent conductive film 13 will never be oxidized even when an oxidation atmosphere is in existence.

Three pieces of specimens in respective processes described above were produced, and the compositions of these films were analyzed. Those specimens were produced under such conditions described hereunder.

First, the insulating film 12 composed of silicon nitride is grown in a thickness of 3,000 Å on the insulating substrate 11 made of glass by a plasma CVD method, then the transparent conductive film 13 composed of ITO is formed in a thickness of 500 Å by a DC sputtering method (FIG. 3), and then patterning is applied to the transparent conductive film 13 (FIG. 4). This is adopted as a specimen A.

Next, the insulating substrate 11 on which the insulating film 12 and the transparent conductive film 13 are formed under the same conditions as the specimen A is placed on an electrode in a chamber of the plasma CVD apparatus, the pressure in the chamber is maintained at 1.0 Torr while introducing hydrogen (H2) gas containing approximately 0.5 at. % of phosphine (PH3) at 180 SCCM into the chamber, and a radio frequency power source of 300 W and 13.56 MHz is connected to the electrodes.

With this, plasma is generated around the insulating substrate 11. In this case, the temperature of the insulating substrate 11 is maintained at 200° C. or below, preferably at room temperature.

Figure 5:
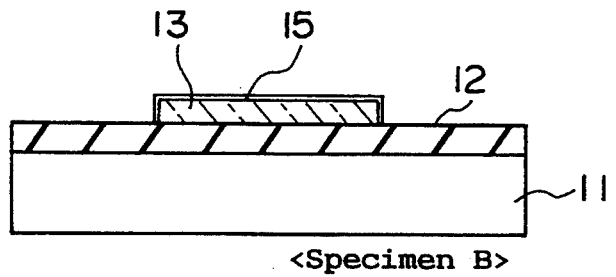

This state is held for 20 minutes, thus forming the growth nucleus layer 15 containing phosphorus on the surface of the transparent conductive film 13 (FIG. 5). This is adopted as a specimen B.

Next, after processing the surface of the transparent conductive film 13 under the same conditions as the specimen B in the chamber of the CVD apparatus, mixed gas of SiH4 and PH3 is introduced intermittently while introducing H2 gas at a constant flow rate into the same chamber, thereby to grow the semiconductor layer 16a composed of silicon doped with phosphorus only on the transparent conductive film 13. SiH4 and PH3 are introduced for several seconds at an interval of several ten seconds. Thereafter, a semiconductor film 16b made of silicon by what is called glow discharge is formed (FIG. 6). This is adopted as a specimen C.

Although this silicon growth method is excellent in a point that microcrystalline silicon can be grown with low resistance, when the bare transparent conductive film 13 having no growth nucleus layer 15 is exposed to hydrogen plasma for a long period of time, it causes deterioration of film quality of the transparent conductive film 13.

Besides, the selective growth of silicon is described in the following citation (1).

(1) G. N. Parsons (Applied Physics Letter, 59(1991) pp. 2546–2548)

Figure 7:
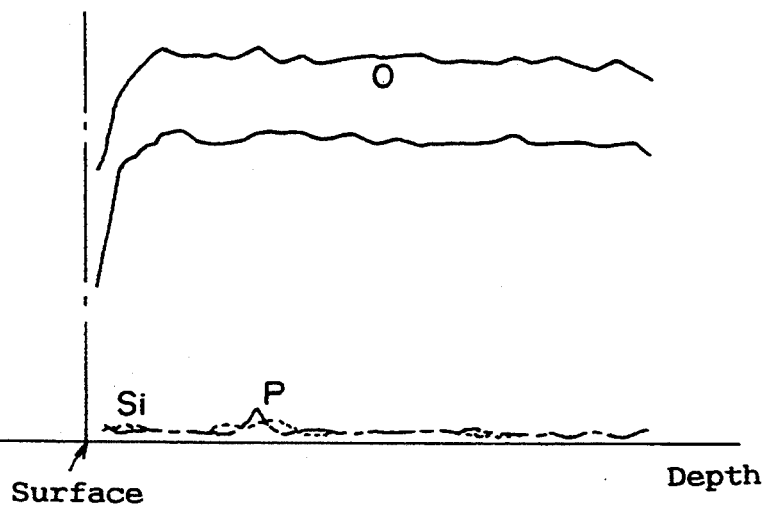
FIG. 7 is an element distribution diagram showing the result of analysis by an AES method of a transparent conductive film before the processing for preventing deterioration of film quality in the second embodiment of the present invention.
Figure 8:
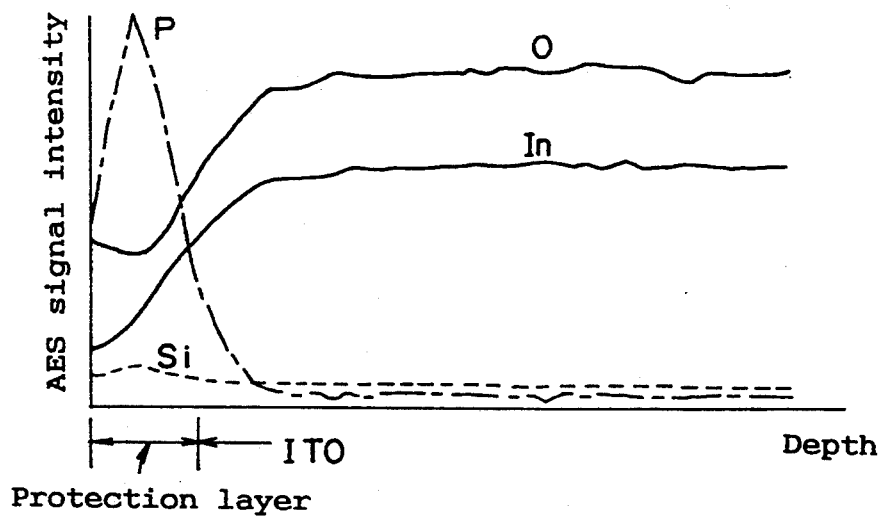
FIG. 8 is an element distribution diagram showing the result of analysis by an AES method after the processing for preventing deterioration of film quality.
Figure 9:
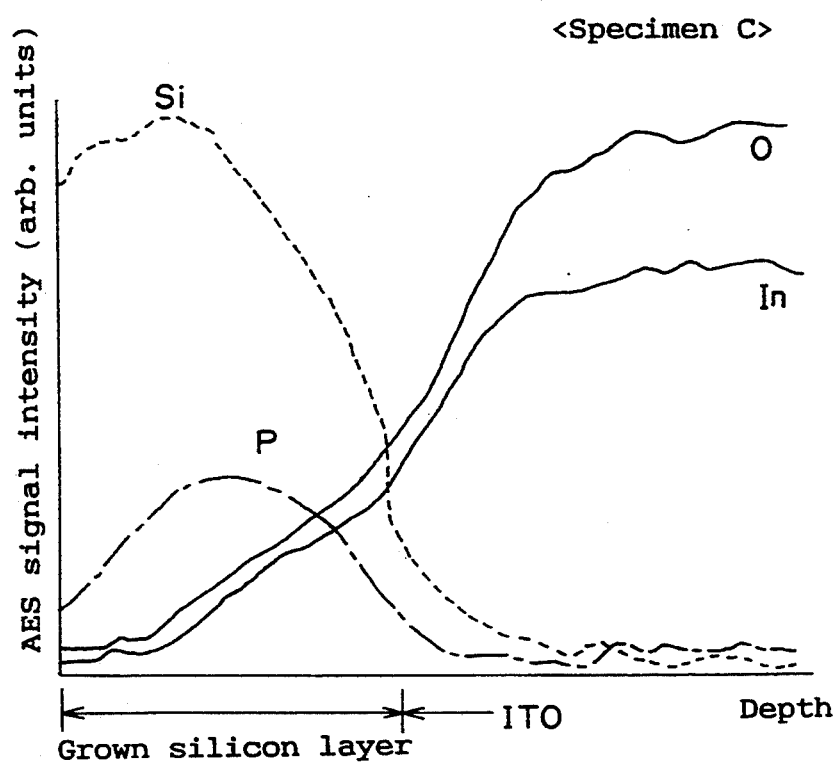
FIG. 9 is an element distribution diagram showing the result of analysis by an AES method after a semiconductor is formed on the transparent conductive film covered with a protective layer in the second embodiment of the present invention.

When the element compositions of the transparent conductive film 13 of these specimens A and B, the transparent conductive film 13 and the semiconductor film 16a of the specimen C were analyzed by an Auger electron spectroscopy (AES) method, the results shown in FIG. 7, FIG. 8 and FIG. 9 were obtained.

Besides, a curve of tin is not shown in these figures, but this is because of such a reason that tin is in existence stably in the transparent conductive film 13 in the process described above.

① FIG. 7 shows the result of analysis of the specimen A, and also shows that oxygen and indium are in existence evenly in the depth direction in the transparent conductive film 13 composed of ITO. Besides, the curves showing phosphorus and silicon fall within a range of measurement errors, and it may be considered that these elements do not exist practically.

(2) FIG. 8 shows the result of analysis of the specimen B, and it is recognized that a compound containing phosphorus, i.e., the growth nucleus layer 15 exists on the surface of the transparent conductive film (ITO film) 13.

Figure 10A:
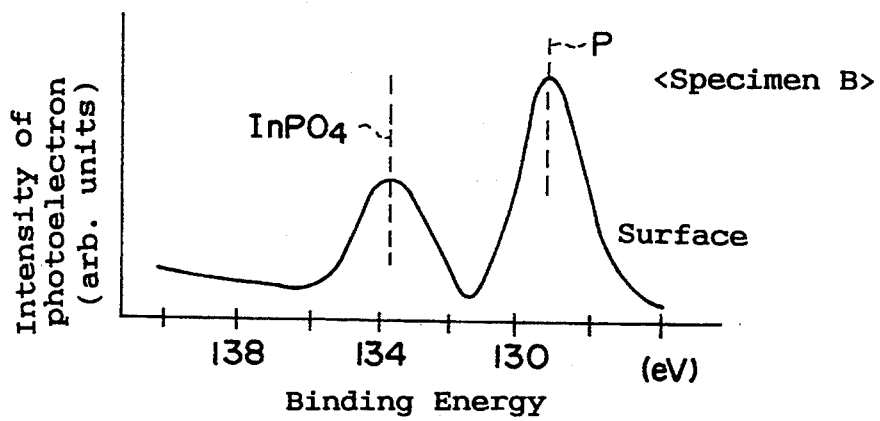
FIG. 10A shows a spectrum showing the result of analyzing a surface of a transparent conductive film applied with processing for preventing deterioration of film quality by an ESCA method while paying attention to phosphorus atoms.

The result of making further observation of the surface of the transparent conductive film 13 by electron spectroscopy for chemical analysis (ESCA) while paying attention to phosphorus is shown in FIG. 10A in regard to the specimen B. According to FIG. 10A, coupling between indium and oxygen (In—O) is not seen on the surface thereof, but it is recognized that the growth nucleus layer 15 composed of $InPO_4$ and P formed by replacing a part of oxygen of ITO with phosphorus has been deposited.

Figure 10B:
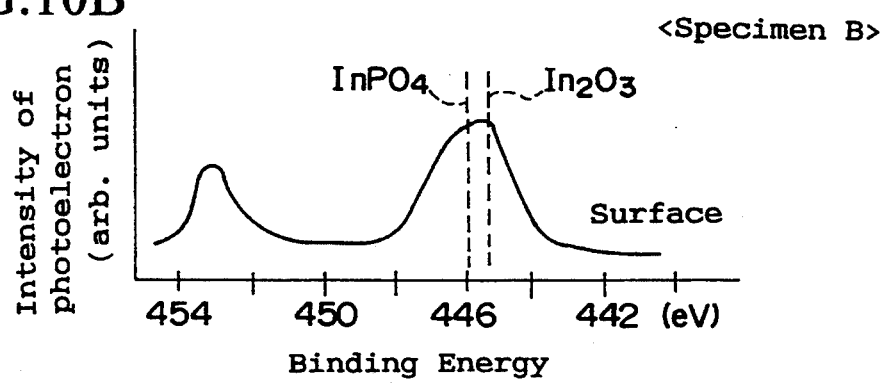
FIG. 10B shows a spectrum showing the result of analyzing the surface of the transparent conductive film by an ESCA method while paying attention to indium atoms.

Further, when the surface of the transparent conductive film 13 is observed by ESCA while paying attention to indium atoms, the result as shown in FIG. 10B has been obtained. With this, it is recognized that there is a peak in the existence of oxidized indium, and the composition of ITO has not been collapsed.

Figure 10C:
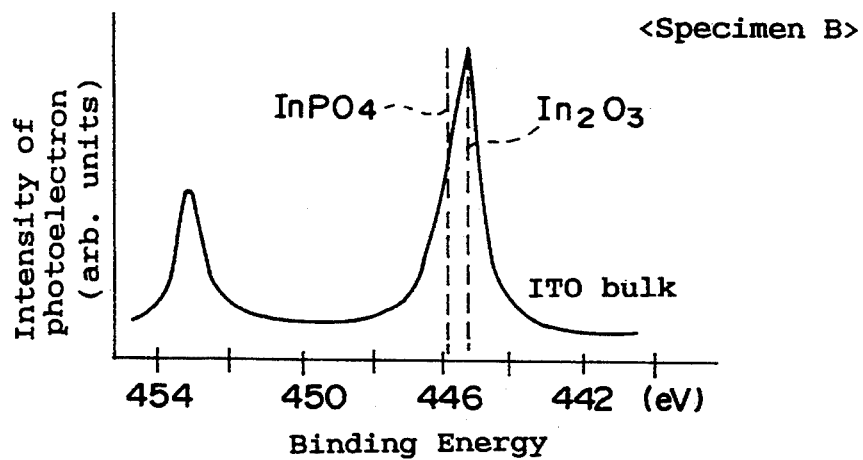
FIG. 10C shows a spectrum showing the result of analyzing the bulk of the transparent conductive film by an ESCA method while paying attention to indium atoms.

Furthermore, when the bulk of the transparent conductive film 13 is observed by ESCA while paying attention to indium atoms, such a result as shown in FIG. 10C is obtained, and it is recognized that, while there is a peak in the existence of oxidized indium, $InPO_4$ and P do not exist, but deterioration of film quality by phosphorus has not been produced. With this, it is verified that the growth nucleus layer 15 is formed only on the surface of the transparent conductive film 13.

(3) FIG. 9 shows the result of analysis of the specimen C. With this spectrum, it is recognized that no such a material that hinders electrical connection exists on an interface between the transparent conductive film (ITO) 13 and the semiconductor film (Si) 16b, and moreover, the reduction of indium of the surface of the transparent conductive film 13 is small.

Figure 11:
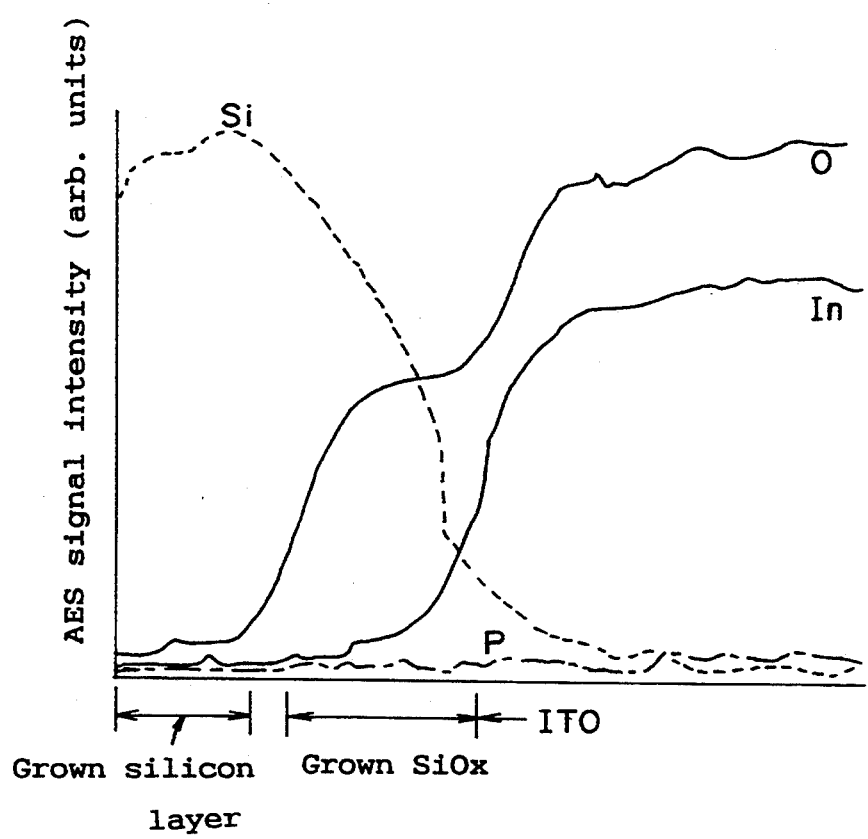
FIG. 11 is an element distribution diagram showing the result of analysis by an AES method of a conventional layer construction in which a semiconductor is grown on a transparent conductive film in the plasma atmosphere without applying processing for preventing deterioration of film quality.

As against the above, when the surface of the transparent conductive film composed of ITO is exposed to $SiH_4$ plasma that is a reduction atmosphere without forming the growth nucleus layer 15 described above, a non-doped silicon film is grown selectively on this transparent conductive film, and the silicon film and the transparent conductive film 13 are analyzed by an AES method, a result such as shown in FIG. 11 has been obtained.

According to this result, it is recognized that oxygen that is liberated from the ITO film by reduction is taken into silicon, $SiO_x$ exists on the interface between the silicon film and the ITO film, and the indium quantity on the interface between the ITO film and the silicon film has been lowered as compared with FIG. 9.

Since $SiO_x$ is in existence as an insulating film, it causes disconnection of electrical contact between the silicon film and the ITO film.

Figure 12A:
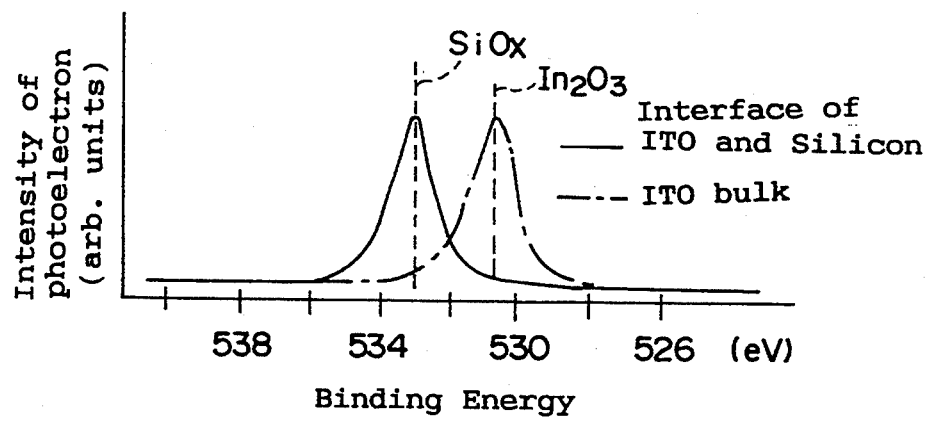
FIG. 12A shows a spectrum showing the result of analyzing an interface between a transparent conductive film and a semiconductor film and the bulk of the transparent conductive film in the conventional layer construction same as that shown in FIG. 9 by an ESCA method while paying attention to oxygen atoms.
Figure 12B:
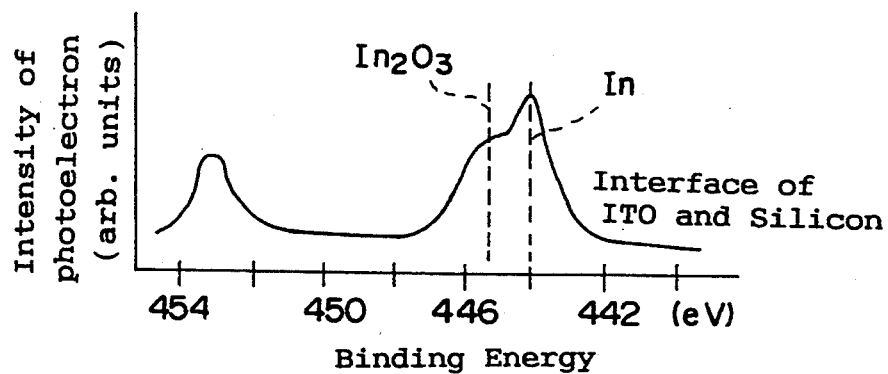
FIG. 12B shows a spectrum showing the result of analyzing the surface of the transparent conductive film by an ESCA method while paying attention to indium atoms.
Figure 12C:
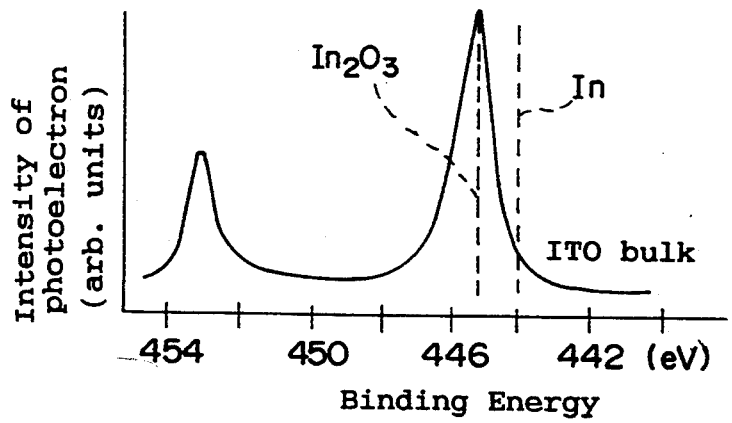
FIG. 12C shows a spectrum showing the result of analyzing the bulk of the transparent conductive film by an ESCA method while paying attention to indium atoms.

Therefore, when the specimen was observed by the ESCA method in order to investigate the composition of the specimen having no growth nucleus layer in detail, the results shown in FIG. 12A to FIG. 12C were obtained.

First, as shown with solid lines in FIGS. 12A to 12C, it is recognized that $SiO_x$ is formed on the interface of the ITO film and the silicon film. This is resulted by that oxygen that is liberated from the ITO film by reduction is coupled with silicon.

Further, there is a peak in coupling energy showing indium (In) rather than $In_2O_3$ that shows the existence of ITO on the interface as shown in FIG. 12B. This is because of a fact that In remains on the surface of the reduced transparent conductive film, and the In causes abnormal growth.

Figure 13A:
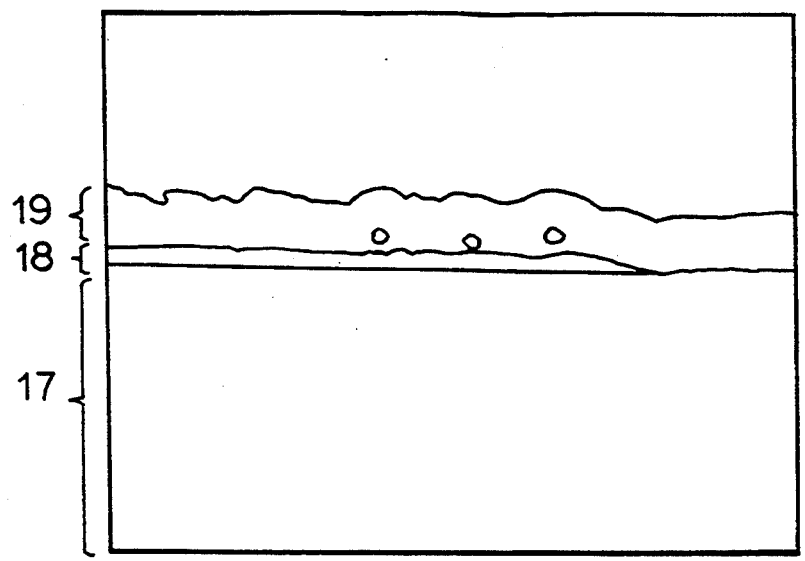
FIG. 13A and FIG. 13B are diagrams depicted based on photographs obtained by observing by TEM a conventional layer construction in which a semiconductor is grown on a transparent conductive film without applying processing for preventing deterioration of film quality.
Figure 13B:
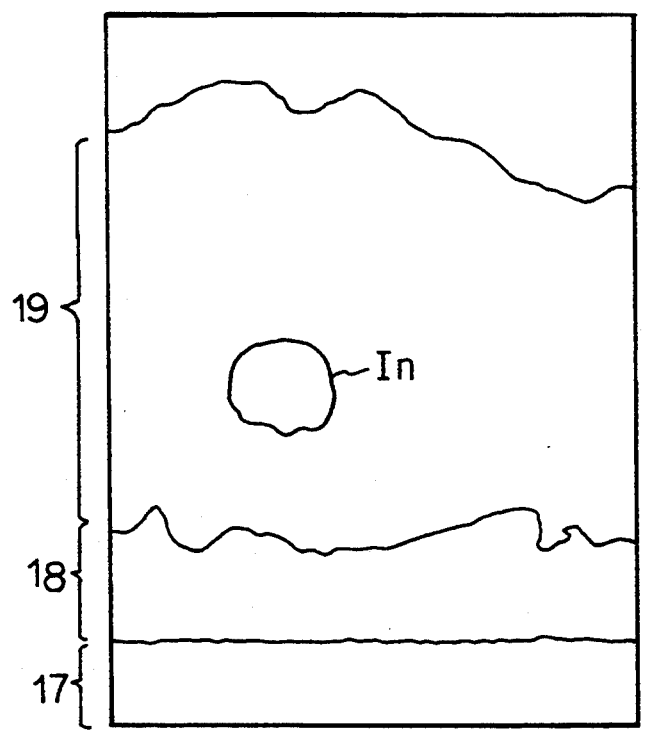

When the abnormal growth is observed with a transmission electron microscope (TEM), In is separated from a transparent conductive film 18 and exists in a silicon film 19 forming a lump above an insulating substrate 17 as seen in FIG. 13A and FIG. 13B. A projected portion is formed on the surface of the silicon film 19 with such a lump, thus causing to impair flatness and film quality of the film.

Further, when the composition of the bulk of the ITO film was investigated, results of analysis shown with a dashed line in FIG. 12A and a solid line in FIG. 12C were obtained, and it was recognized that the composition of the ITO film had not been collapsed.

Based on these experimental results, it has been recognized that the surface of ITO that is not covered by the growth nucleus layer is reduced when silicon is grown.

Next, as an example showing variation of the transparent conductive film with respect to another reducing atmosphere, an experimental result obtained when the transparent conductive film is exposed to hydrogen plasma will be described.

Figure 14A:
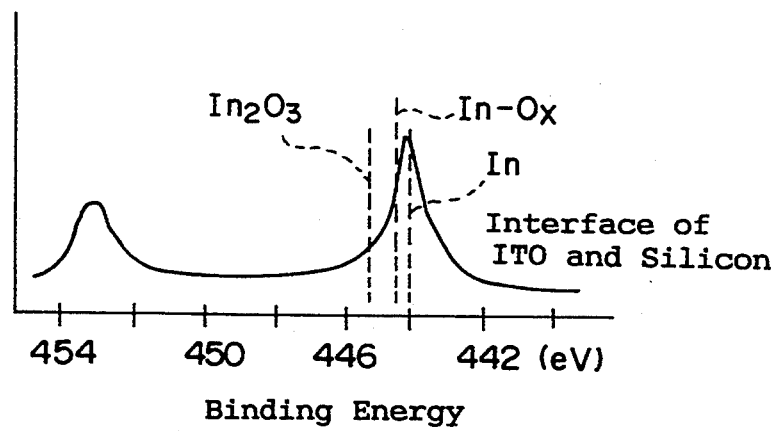
FIG. 14A shows a spectrum showing the result of analyzing an interface between a transparent conductive film and a semiconductor film in a laminated construction in which a semiconductor is grown after exposing the transparent conductive film to hydrogen plasma without applying processing for preventing deterioration of film quality by an ESCA method while paying attention to indium atoms.

An example of analysis by ESCA of the surface of the ITO film when it is placed in hydrogen plasma for 10 minutes at a substrate temperature of 200° C. and silicon is deposited thereafter is shown in FIG. 14A and FIG. 13B.

Figure 14B:
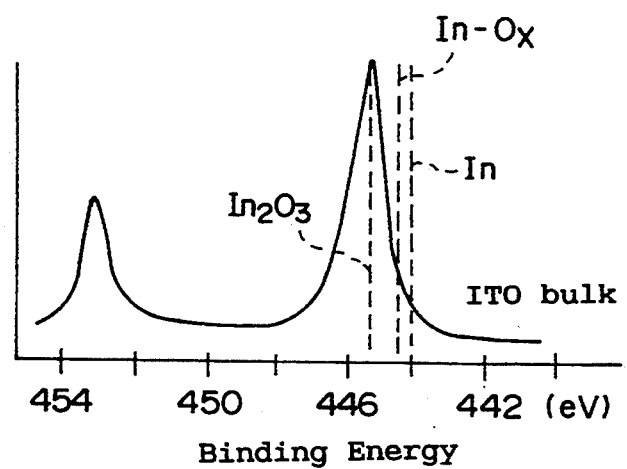
FIG. 14B shows a spectrum showing the result of analyzing the bulk of the transparent conductive film by an ESCA method while paying attention to indium atoms.

In FIG. 14A showing an interface between the ITO film and the silicon film, the surface of ITO is reduced and generation of metallic indium (In) and In—$O_x$ in a low oxidation quantity is noticed. When a—Si:H or the like is formed on a film where these elements are in existence, diffusion of In into a—Si:H as stated previously is brought about, which causes to produce abnormal growth of silicon. Besides, as shown in FIG. 14B, the composition has not collapsed in the bulk of the ITO film.

Figure 15:
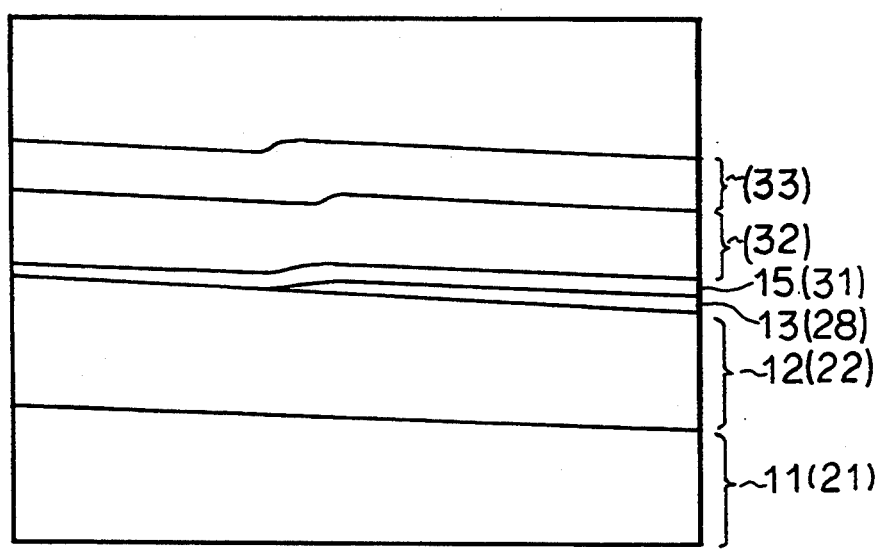
FIG. 15 is a diagram depicted based on a photograph showing a laminated construction when processing for preventing deterioration of film quality according to the second embodiment of the present invention is applied.

As against the above, when the growth nucleus layer 15 containing an element in group Vb is formed on the surface of the transparent conductive film 13 composed of ITO like the present invention, and the semiconductor film 16 is formed thereon in an atmosphere including hydrogen plasma as described previously, neither a lump of indium and irregularity of the semiconductor film 16 cannot be seen as shown in FIG. 15, and moreover, generation of In—$O_x$ in low oxidation quantity on the surface of ITO cannot be seen even by the analysis by ESCA. Besides, the element in group Vb constituting the growth nucleus layer 15 does not exist as a layer because of a fact that the element is taken into the semiconductor film 16 when it is formed and so on.

Besides, plasma was generated as the active atmosphere so as to stick or inject an element in group Vb when the above-mentioned growth nucleus layer 15 was formed. However, the atmosphere is not limited to plasma, but may be optical CVD utilizing excitation of a surface reaction by ultraviolet rays or thermal CVD for heating gas or substrate, and may also be a method using these methods at the same time.

Besides, mixed gas of $PH_3$ and $H_2$ was used as the gas used when the growth nucleus layer 15 was formed in the above description, but any gas containing $NH_3$, $N_2$, $AsH_3$ or the other element in group Vb is also applicable in a similar manner.

When the growth nucleus layer 15 is formed using $NH_3$ for instance, conditions as described hereunder are to be established.

The transparent conductive film (ITO) 13 applied with patterning as described above is placed on an electrode in a chamber of a plasma CVD apparatus, $NH_3$ gas is introduced into the chamber at a flow rate of 100 SCCM, the pressure is maintained at 1.0 Torr, and electric power of 13.56 MHz and 300 W is applied to the electrode, thereby to generate plasma around the ITO film.

Then, the insulating substrate 11 was maintained at 200° C. or below, preferably at room temperature and was left in plasma as it is for 20 minutes. When the ITO film at this time was analyzed by a secondary ion mass spectroscopy (SIMS) method, the result shown in FIG. 16 was obtained.

Figure 16:
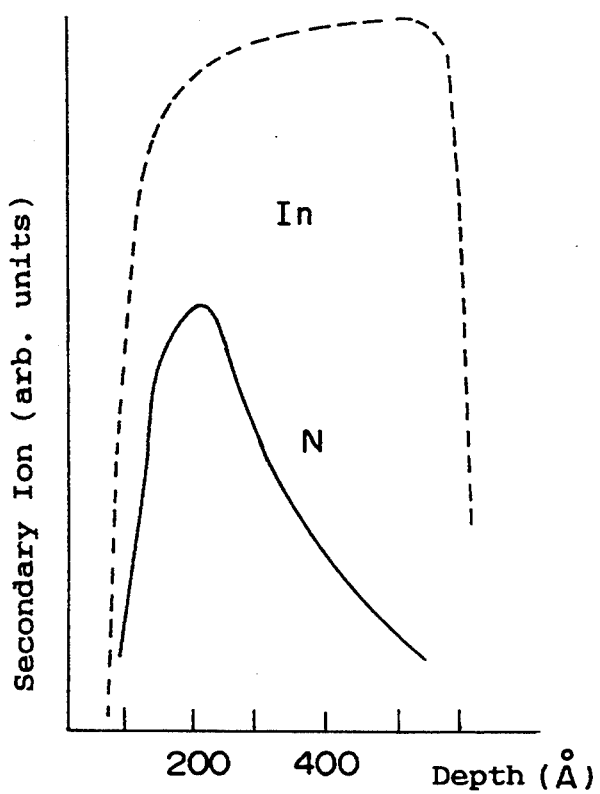
FIG. 16 is an element distribution diagram showing the result of SIMS analysis of indium and nitrogen of a transparent conductive film when nitrogen gas is used in processing for preventing deterioration of film quality according to the second embodiment of the present invention.

According to FIG. 16, nitrogen (N) that is considered as the origin of indium nitrate in a thickness of approximately 100 Å toward the inside from the outermost surface of the transparent conductive film 13 is detected. This layer shows resistance against the reducing atmosphere, and functions as the growth nucleuses. For example, even when the transparent conductive film is exposed at a substrate temperature at 270° C. for 10 minutes to the plasma generated by radio frequency electric power at 200 W, no quality change occurs in the transparent conductive film.

Next, the reason why the substrate temperature is set to 200° C. or below when the growth nucleus layer is formed on the surface of the transparent conductive film will be described.

It has been well known that oxygen is released from an ITO film when, for example, the plasma atmosphere contains a reducing material such as hydrogen in a process of forming a film on the surface of the ITO film by plasma CVD.

When the temperature of the ITO film is 200° C. or below, such a reaction that the reducing material in plasma such as a hydrogen radical extracts oxygen slightly on the surface of the ITO film and an element in group Vb coupled at the same time at a position where oxygen has drifted away is accelerated.

When the temperature of the ITO film reaches 200° C. or higher, however, an oxygen drift-away phenomena occurs principally rather than a coupling reaction between the ITO film and the element in group Vb, and the composition of the film is dissolved, thus causing deterioration.

In addition to the above, when the growth nucleuses 15 are formed of a compound containing phosphorus, a vapor pressure of phosphorus reaches $2 \times 10^{-1}$ Torr in the atmosphere at 200° C. or higher. Thus, phosphorus becomes liable to volatilize at the pressure of 0.001 to 10 Torr of the atmosphere of a general plasma CVD process and the growth nucleus layer 15 becomes more difficult to be formed. On the contrary, since the vapor pressure of phosphorus reaches $2 \times 10^{-2}$ Torr in the atmosphere in the neighborhood of room temperature, phosphorus becomes more difficult to volatilize, and the growth nucleus layer 15 is formed more easily.

It may safely be said that it is sufficient that the substrate temperature for the formation of the growth nucleus layer is 200° C. or below, but room temperature is most desirable when these points are taken into consideration.

The Third Embodiment

The present invention is one that shows a method of forming a TFT in a liquid crystal display unit, and includes a process of forming the growth nucleuses on the surface of the transparent conductive film described above.

Prior to the description of the embodiment, a general construction of the liquid crystal display unit will be described with reference to FIG. 17A and FIG. 17B.

Figure 17A:
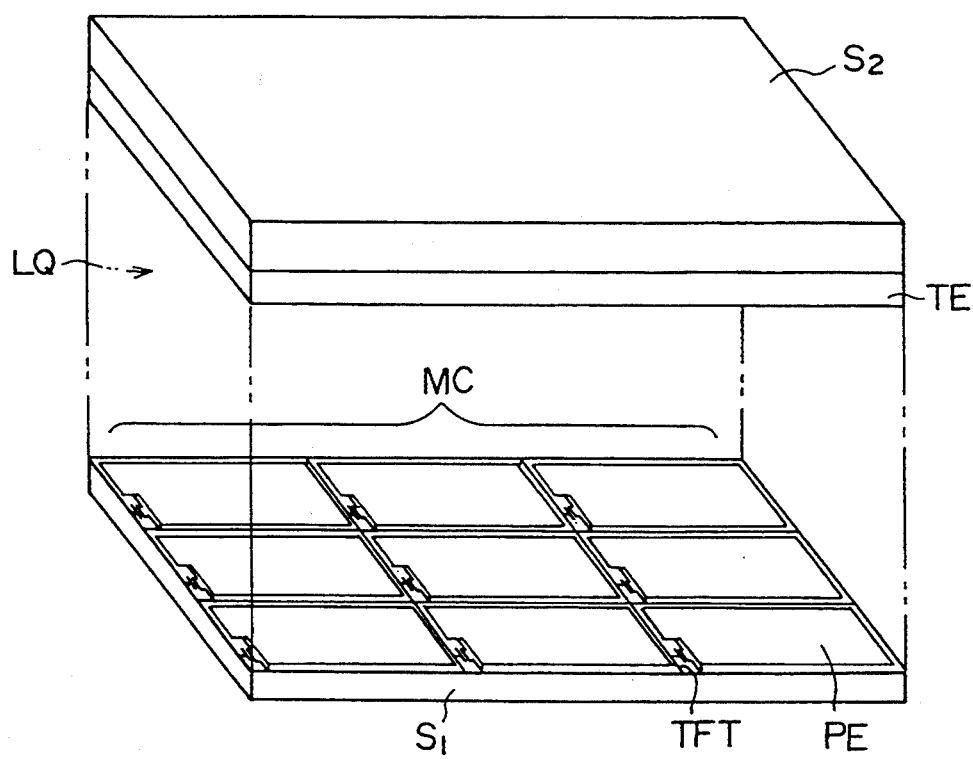
FIG. 17A is a schematic structural view of a liquid crystal display unit.
Figure 17B:
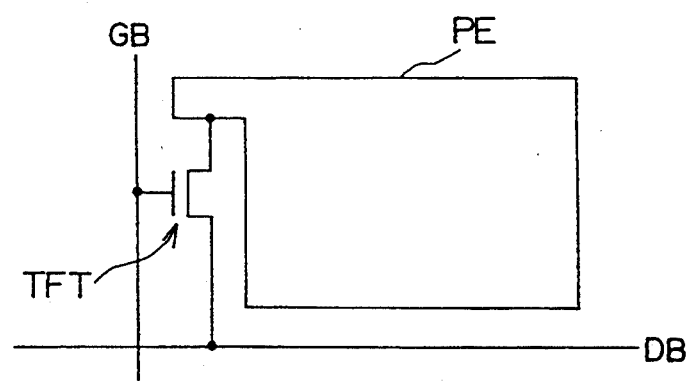
FIG. 17B is an equivalent circuit diagram showing a picture element and a TFT of the liquid crystal display unit.

In the liquid crystal display unit, as shown in FIG. 17A, a surface of a first insulating transparent substrate $S_1$ and the under surface of a second insulating transparent substrate $S_2$ are arranged so as to face each other leaving a space therebetween, a matrix circuit MC is formed on the surface of the first insulating transparent substrate $S_1$ and a transparent electrode TE is formed on the under surface of the second insulating transparent substrate $S_2$. Further, a liquid crystal LQ is interposed between the transparent electrode TE and the matrix circuit MC.

The matrix circuit MC includes a plurality of TFTs arranged in a matrix form and a plurality of picture element electrodes PEs that form a pair with the TFT, respectively. A gate of the TFT is connected to a gate bus line GB extending in one direction as shown in FIG. 17B, a drain of the TFT is connected to a drain bus line DB extending in a direction meeting at right angles with the gate bus line GB, and further, a source of the TFT is connected to the picture element electrode PE. Besides, the gate bus line GB and the drain bus line DB are insulated from each other through an insulating film not illustrated.

Further, the direction of light transmission of the liquid crystal LQ in a region located above a picture element is varied by the voltage applied between the picture element electrode PE and the transparent electrode TE, thereby to realize picture element display. Besides, the gate bus line GB and the drain bus line DB are called a seam bus line and a data bus line, sometimes, respectively.

Next, a process of forming the picture element electrode and the TFT connected thereto will be described with reference to FIG. 18A to FIG. 18G.

Figure 18A:
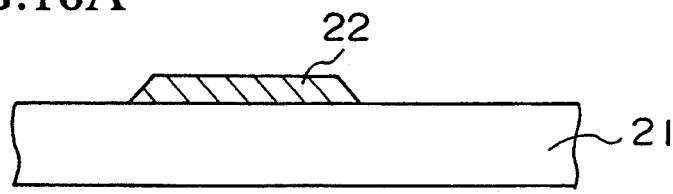
FIG. 18A to FIG. 18G are sectional views showing a process of forming a picture element electrode and a TFT according to a third embodiment of the present invention.

First, a Cr film is formed in the thickness of 1,000 Å on an insulating transparent substrate 21 composed of glass, quartz or the like by DC sputtering. Then, as shown in FIG. 18A, patterning is applied to the Cr film by photolithography, thereby to form a shading film 22 in a TFT forming region. This shading film 22 is formed for the purpose of preventing increase of a dark current of a TFT to be produced.

Figure 18B:
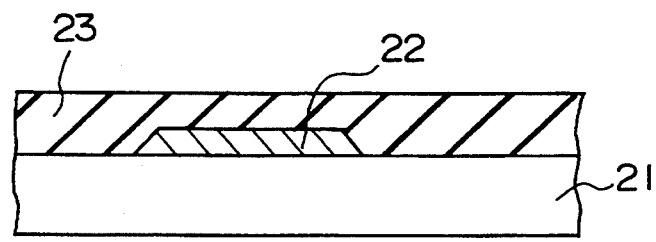

Next, as shown in FIG. 18B, $SiN_x$ is formed by plasma CVD as an interlayer insulating film 23 covering the shading film 22 and the transparent substrate 21.

Figure 18C:
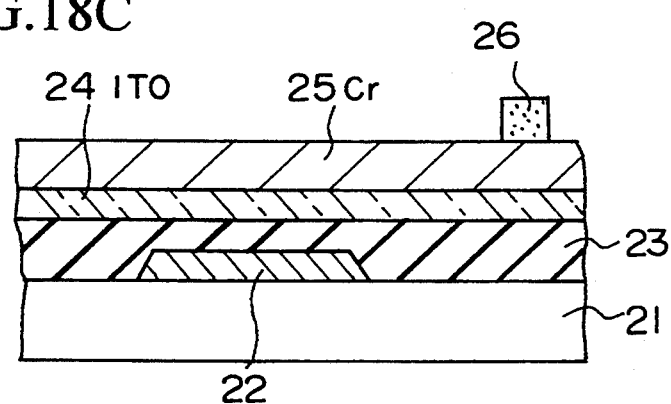

Thereafter, as shown in FIG. 18C, an ITO film 24 having the film thickness of 500 Å and a Cr film 25 having the film thickness of 1,500 Å are formed consecutively by DC sputtering. Then, photoresist 26 is applied onto the Cr film 25, and is exposed and developed so as to form a pattern along a drain bus line forming region. Then, the photoresist 26 is used as a mask and patterning is applied to the Cr film 25 using an etchant composed of cerium diammonium nitrate and perchloric acid, thereby to form the drain bus line DB composed of the Cr film 25.

Figure 18D:
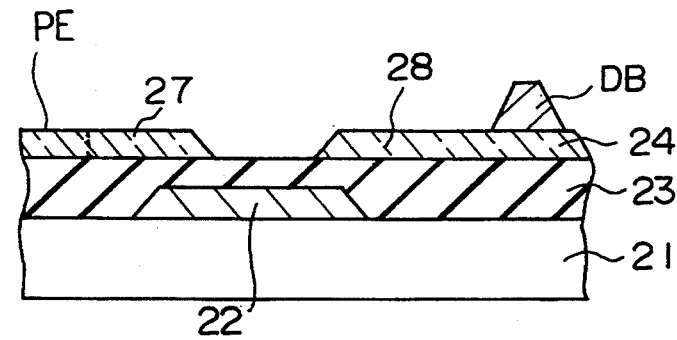

After removing the photoresist 26, a pattern of another photoresist (not illustrated) is formed on the ITO film 24, and patterning is applied to the ITO film 24 using this photoresist and an etchant of nitric acid and hydrochloric acid group. With this, as shown in FIG. 18D, a source electrode 27 and a drain electrode 28 separated from each other are formed on the shading film 22 are formed, and the picture element PE unified with the source electrode 27 is also formed.

Next, after removing the photoresist, the transparent substrate 21 is placed on one of a pair of electrodes in a chamber of a plasma CVD apparatus not shown. Then, after reducing the pressure in the chamber, hydrogen gas containing $PH_3$ at 0.5 at. % is introduced therein at a flow rate of 180 SCCM, the pressure is maintained at 1.0 Torr, and a radio frequency power source of 13.56 MHz and 300 W to the electrodes. Under such conditions, plasma is generated around the transparent substrate 21.

The temperature of the transparent substrate 21 in this case is set to a constant temperature within a range of 200° C. or below and room temperature or above by heating with a heater, or is maintained preferably at room temperature.

Figure 18E:
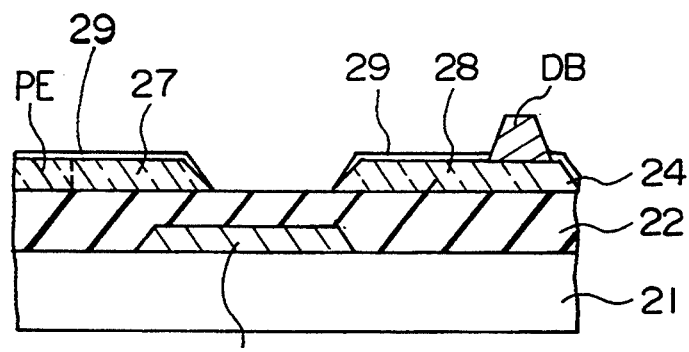

Under such conditions, phosphorus sticks to the surface of the ITO film 24 placed in the plasma atmosphere, and the growth nucleuses 29 for preventing reduction are formed on the surface as shown in FIG. 18E.

Thereafter, the reaction gas in the chamber is purged by an inert gas.

Then, $H_2$ gas is introduced into the chamber at the flow rate of 400 SCCM, the pressure is maintained at 1.0 Torr, and the temperature of the transparent substrate 21 is raised to 270° C. Further, the output of the radio frequency power source is lowered to 200 W. In this state, hydrogen plasma is being generated around the transparent substrate 21.

Figure 18F:
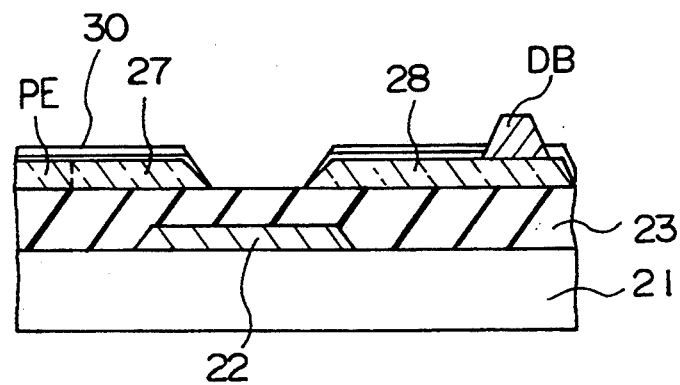
Figure 18G:
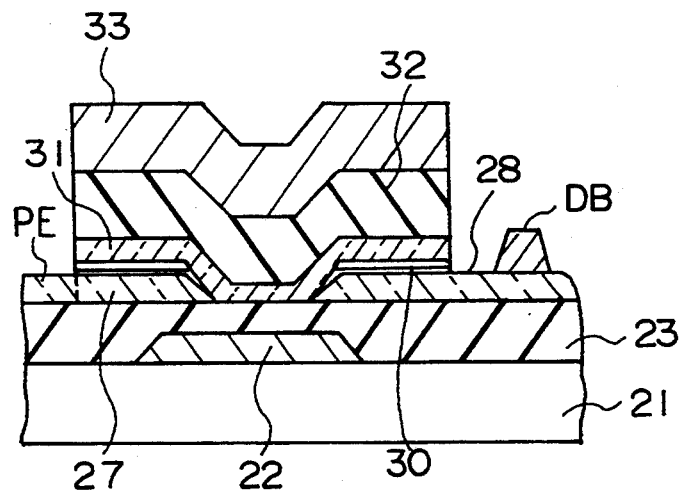

Under such conditions, mixed gas of $SiH_4$ and $PH_3$ is introduced intermittently, thereby to grow a phosphorus doped silicon film only on the transparent conductive film selectively. Mixed gas of hydrogen gas containing $PH_3$ having concentration of 5 at. % at 150 SCCM and $SiH_4$ at 25 SCCM is used for the selective growth. Then, the operation of introducing the mixed gas for 4 seconds in 50 seconds is assumed to be one cycle, and an n+ type silicon layer 30 of micro crystalline silicon (u—C Si) such as shown in FIG. 18F is formed in the thickness of 200 Å by performing 120 cycles in total (for 100 minutes) of the operation.

The ITO film 24 is exposed to hydrogen plasma for a long time in the growth of silicon, but deterioration of the film quality is prevented by means of a reduction-resistant growth nucleus layer 29. Since the details thereof have been stated already in the second embodiment, the description thereof is omitted.

Following to the above, after forming an amorphous silicon film that becomes a active semiconductor layer 31 and a $SiN_x$ film that becomes a gate insulating film 32 are formed consecutively in the thickness of 800 Å and 3,000 Å, respectively, by plasma CVD as shown in FIG. 18D, the transparent substrate 21 is taken out of the chamber. Then, an aluminum film that becomes a gate electrode 33 is deposited in the thickness of 3,000 Å by DC sputtering.

Sections of respective layers described so far are shown in FIG. 15, and it is seen that no irregularity has been generated in the active semiconductor layer 31.

Next, by using photolithography technique, patterning is applied continuously to from the aluminum film over to the active semiconductor layer so as to form the gate electrode 33 composed of an aluminum film and a gate bus line GB not illustrated, and to perform isolation between the gate insulating film 32 and the active semiconductor layer 31 collectively at the same time.

With this, the process of forming the picture element electrode and the TFT is completed.

According to the process described above, deterioration of the film quality of the ITO film 24 forming the source electrode 27 and the drain electrode 28 of the TFT is prevented, on and off currents of the transistor both show sufficient characteristics for driving the liquid crystal, and inferiority by abnormal growth as heretofore experienced has not been produced. Further, lowering of light transmittance and conductivity is controlled without deteriorating the film quality of the ITO film 24 constituting the picture element electrode PE.

Now, in the explanation described above, the interlayer insulating film 23 is formed of silicon nitride, and silicon is grown on the ITO film formed thereon. However, even if the interlayer insulating film 23 is formed of silicon oxide, the growth nucleuses are in existence on the ITO film. Thus, silicon is grown selectively thereon. Further, in a structure that a picture element electrode composed of ITO is formed on a quartz substrate, a glass substrate or the like and the growth nucleuses are formed on the surface of the picture element electrode without forming the interlayer insulating film, a silicon layer is grown selectively on the picture element electrode. The details thereof have been described in the first embodiment.

The Fourth Embodiment

In the first embodiment, a transparent conductive film has been used as a substrate layer on which silicon is grown selectively, and the transparent conductive film has been placed in a reducing atmosphere containing an element in group IIIb, group IVb, group Vb, group VIb or group VIIb in order to form the growth nucleuses having a chemical disposition different from that of the inside on the surface thereof. A film forming technique is used in the present embodiment instead of the reforming method as a method of forming a chemical growth nucleus layer different from the inside. The method will be described in the next place.

FIG. 19A to FIG. 19D are sectional views showing selective growth in the fourth embodiment of the present invention.

Figure 19A:
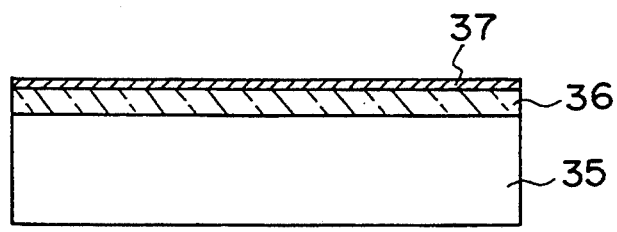
FIG. 19A to FIG. 19D are sectional views showing a method of selective growth according to a fourth embodiment of the present invention.

First, as shown in FIG. 19A, a transparent conductive film 36 composed of ITO for instance is formed in the thickness of 500 Å by a sputtering method on an insulating substrate 35 composed of quartz, glass or the like. A semiconductor in groups III–V, or groups II–VI is grown thereon by an MBE method, an MOCVD method or the like, and is used as the growth nucleuses 37. In particular, the growth nucleuses having good light transmittance is obtainable by using a material having a wide energy band gap such as indium nitride (InN), gallium nitride (GaN) or the like, and such material is preferable as one to be formed on the transparent conductive film 36. InN and GaN have an energy band gas of 3 eV or higher.

Figure 19B:
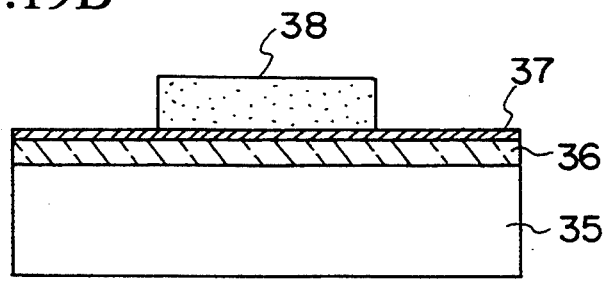

Next, as shown in FIG. 19B, photoresist 38 is applied and a pattern is formed by exposing and developing the photoresist. Thereafter, etching is applied to the transparent conductive film 36 and the growth nucleus layer 37 with the photoresist 38 as a mask, thereby to form a conductive pattern 39.

Figure 19C:
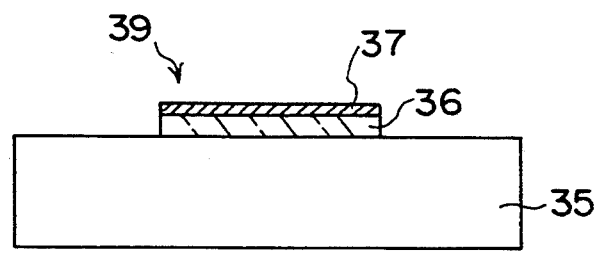
Figure 19D:
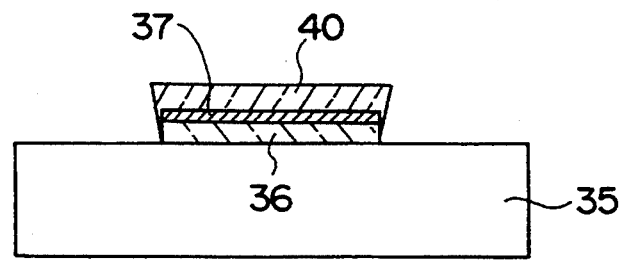

Then, after the photoresist 38 is removed as shown in FIG. 19C, etching and deposition are repeated once or more under the conditions illustrated in the first embodiment so as to grow a silicon layer 40 selectively as shown in FIG. 19D.

Since the conductive pattern 39 and the insulating transparent substrate 35 located therearound have different chemical dispositions from each other, excellent selective growth is achievable by this method similarly to the first embodiment. Moreover, since it is possible to apply patterning to the growth nucleus layer 37 simultaneously with the transparent conductive film, the pattern accuracy of the growth nucleus layer 37 is not impaired. In addition, the present embodiment is superior to the first embodiment in a point that the material of the growth nucleus layer can be set freely.

Besides, a similar effect can be obtained even when an intermetallic compound of a metal element and silicon what is called silicide is applied as the growth nucleus layer.

The Fifth Embodiment

Figure 20A:
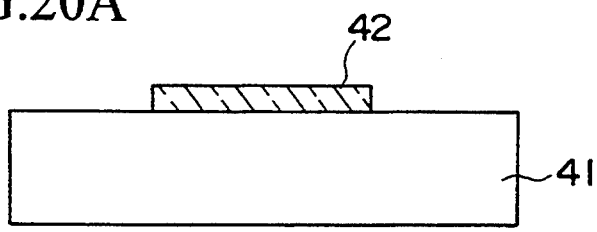
FIG. 20A to FIG. 20C are sectional views showing a method of selective growth according to a fifth embodiment of the present invention.
Figure 20B:
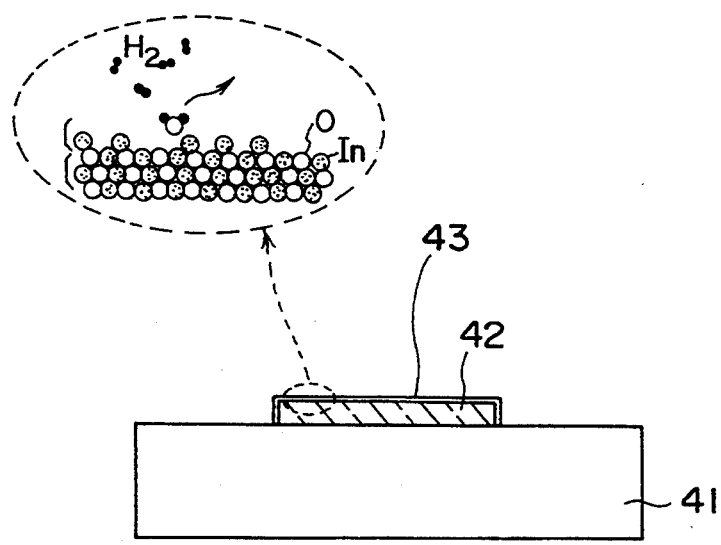
Figure 20C:
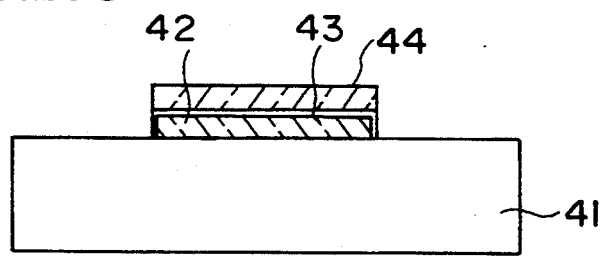

FIG. 20A to FIG. 20C are sectional views showing a selective growth method in a fifth embodiment of the present invention.

First, as shown in FIG. 20A, a transparent conductive film 42 composed of ITO that is an oxide transparent conductive film is formed on an insulating substrate 41, and a pattern of the transparent conductive film 42 is formed by photolithography technique.

Next, in an ordinary plane-parallel plate type plasma CVD apparatus, the substrate temperature is set to 270° C., a hydrogen gas is introduced into a chamber, the pressure is maintained within a range from 1 Torr or higher to 50 Torr or lower, preferably at 1.0 Torr, and radio frequency electric power of a frequency of 13.56 MHz and an output of 200 W is supplied to the electrode putting the substrate therebetween, thereby to generate hydrogen plasma. With this, the surface of ITO that is an oxide is reduced by the reducing atmosphere of hydrogen plasma, and oxygen couples with hydrogen selectively and is sublimated. As a result, the growth nucleuses 43 composed of In and Sn is formed on the surface of the transparent conductive film 42 as shown in FIG. 20B.

Thereafter, when a silicon layer 44 was grown selectively on the transparent conductive film 42 by repeating etching and deposition once or more under the conditions illustrated in the first embodiment as shown in FIG. 20C, better selective growth was obtained as compared with a case when reduction processing is not performed, This is due to a fact that the surface composed of metallized In and Sn is coupled with silicon more easily as compared with ITO. When the growth nucleus layer 43 is formed utilizing a reducing process, however, ITO changes in quality, thus causing a fear that conductivity is lowered, as described in the second embodiment. Hence, reduction has to be performed in a very short time, e.g. one minute or shorter.

Further, in order to stabilize an In element that is easily let loose when the silicon layer 44 is grown selectively, a material that combines easily with In and Sn such as phosphorus (P) may be added into hydrogen plasma. For example, $PH_3$ gas may be added so as to obtain concentration at approximately 0.5 at. %.

The method of forming the growth nucleuses according to the present embodiment is featured by a point that the chemical disposition of the transparent conductive film is made different from that of the surface therearound by removing a type of element in the materials constituting the transparent conductive film and the compound semiconductor.

The Sixth Embodiment

In the above-mentioned embodiment, the formation of a substrate layer on which a film is grown selectively and the formation of the growth nucleuses are performed by different processes. In the present embodiment, a method of forming the substrate layer and the growth nucleus layer through the same process will be described.

Figure 21A:
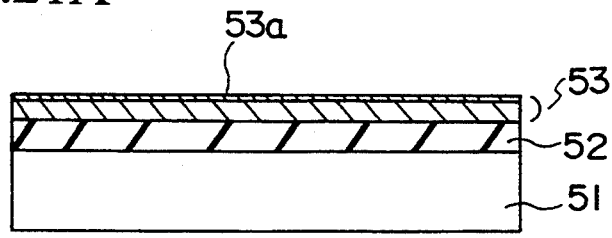
FIG. 21A to FIG. 21C are sectional views showing a method of selective growth according to a sixth embodiment of the present invention.
Figure 21B:
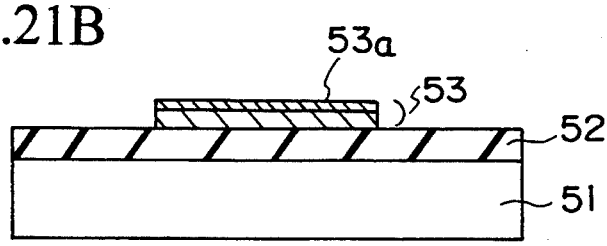
Figure 21C:
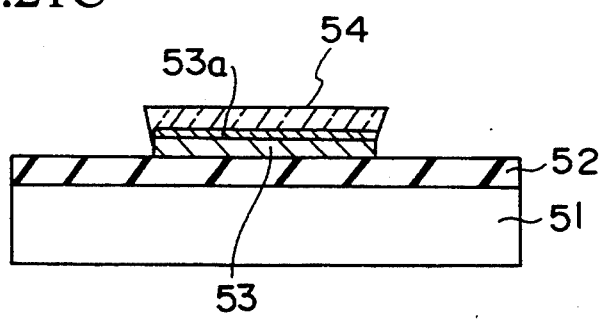

FIG. 21A to FIG. 21C are sectional views showing a selective growth method according to a sixth embodiment of the present invention.

First, as shown in FIG. 21A, a silicon nitride film 52 is deposited on an insulating substrate 51 of quartz, glass or the like by a plasma CVD method.

Then, a chrome (Cr) film 53 having the film thickness of 1,000 Å is deposited on a silicon nitride film 52 by a vapor deposition method. At that time, oxygen is introduced into the chamber of the vapor deposition apparatus so as to form the atmosphere at $5 \times 10^{-5}$ Torr, and oxygen of approximately 10 at. % is introduced into the surface layer of the Cr film 53 so as to form an oxygen containing chrome ($CrO_x$) layer (the growth nucleuses) 53a when the upper layer 30 Å thick in the Cr film 53 is formed.

Thereafter, as shown in FIG. 21B, patterning is applied to the oxygen containing chrome layer 53a and the Cr film 53 by a photolithography method.

Next, when etching and deposition are repeated once or more under the conditions illustrated in the first embodiment so as to grow a silicon film 54 on the Cr film 53 as shown in FIG. 21C, it has been found that the present embodiment is superior in selective growth performance as compared with a case that the $CrO_x$ layer 53a is not formed. For example, a growth rate of a silicon film at 3 Å/minute was obtained when the $CrO_x$ layer 53a was formed, and a growth rate at 1 Å/minute was obtained when the $CrO_x$ layer 53a was not provided. The oxygen contained in the Cr film 53 becomes $SiO_x$ at time of selective growth of silicon and acts to fix silicon so as to assist selective growth. As a result, the margin of the process has been enlarged.

In order to analyze such an embodiment, a following experiment was made.

First, a first specimen in which a Cr film made to contain oxygen positively in at least the surface was formed on a glass substrate as described above and a second specimen in which a Cr film was formed on a glass substrate by a DC sputtering method were prepared. The thickness of both of these Cr films was set to 1,000 Å.

Then, an n-type silicon film was formed on the Cr films of the first and the second specimens by selective growth by means of plasma CVD illustrated in the first embodiment.

Figure 22:
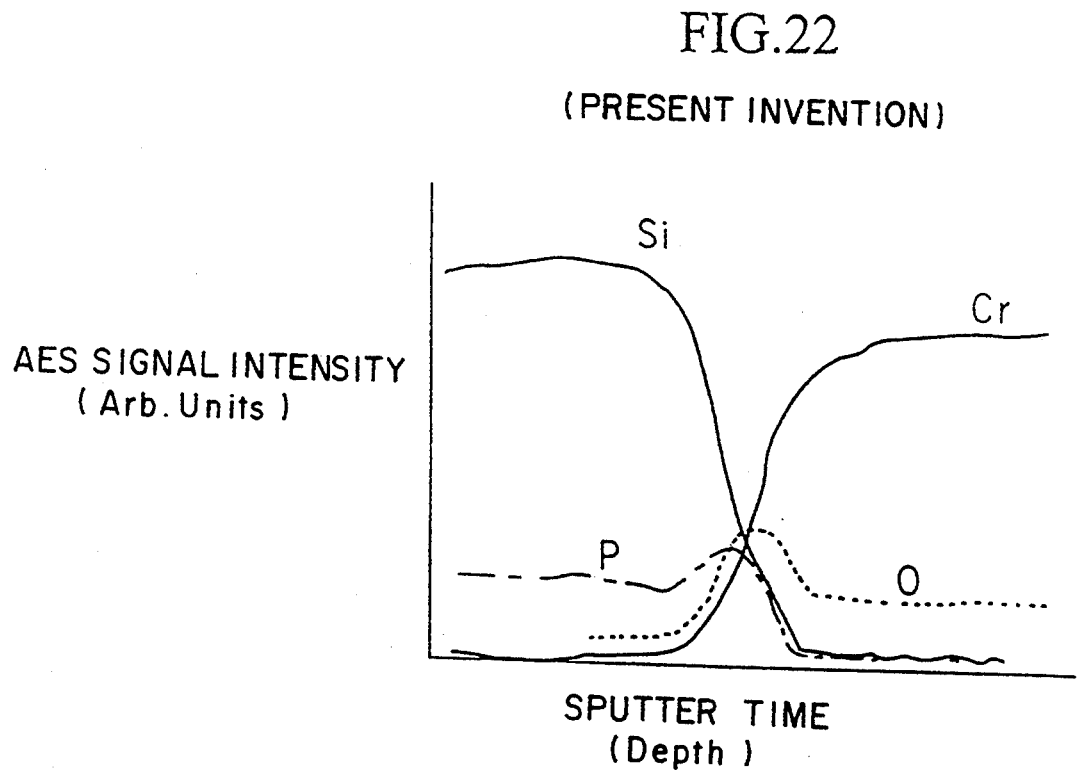
FIG. 22 is an element distribution diagram of a layer construction obtained by selective growth of a semiconductor in the sixth embodiment of the present invention.
Figure 23:
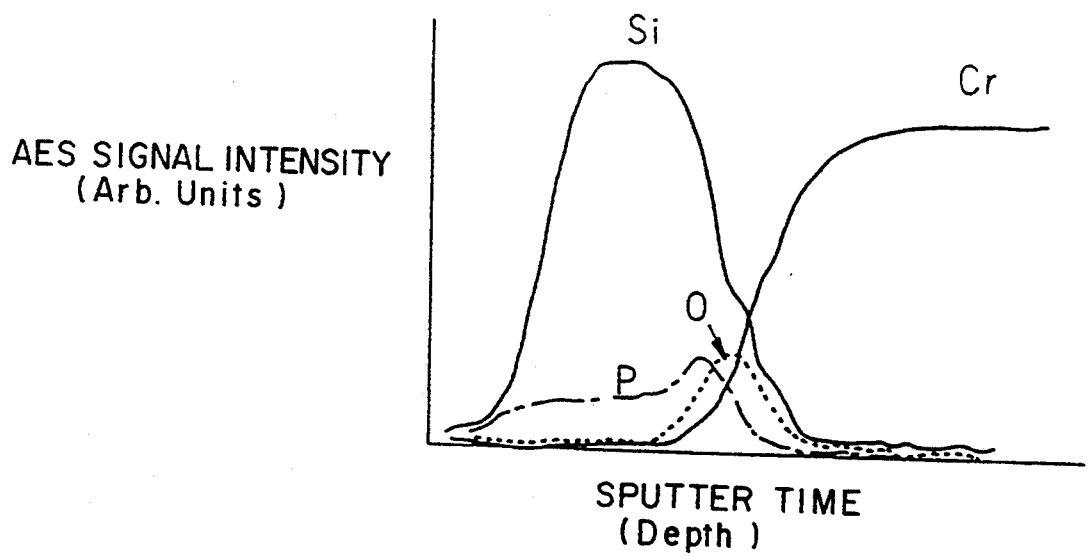
FIG. 23 is an element distribution diagram of a layer construction when a semiconductor is grown selectively by conventional technique.

FIG. 22 and FIG. 23 show the result of composition analysis in the depth direction after selective growth of silicon is made on the Cr film with respect to the first and the second specimens.

When these are compared with each other, it is found that the film thickness of silicon is thicker in the first specimen, and that the volume of the silicon film has been increased because of the existence of oxygen. Although oxygen is also noticed on the interface between the Cr film and the silicon film in the second specimen, this is due to a natural oxide film, and an oxygen quantity of such a level is insufficient for growing silicon selectively, thus requiring to have oxygen contained from the exterior positively and intentionally.

Besides, oxygen may be contained in the whole inside of the Cr film 53, but excessive introduction of oxygen incurs deterioration of an electric characteristic. Therefore, it is desirable to distribute the oxygen containing layer unevenly only on the surface of the Cr film 53 by modulating the introduction of oxygen.

Further, the present embodiment is featured by that, simultaneously with formation of a substrate layer grown selectively, the element in group IIIb, group IVb, group Vb, group VIb or group VIIb that does not constitute that substrate layer is introduced into at least the surface thereof, thus making chemical processing unnecessary. Although oxygen has been used as the element for fixing silicon, the element is not limited thereto, but carbon, iodine halogen group element or the like may also be used for instance.

Besides, the metallic film is used as the source.drain electrode of the TFT such as shown in the third embodiment, and the impurity containing silicon layer formed thereon is used as a contact layer with the channel layer.

Other Embodiments

In the first embodiment, in order to form on the surface of the substrate layer to be grown selectively the growth nucleuses having a chemical property different from that of the inside of the substrate layer, the substrate layer has been placed in the reacting atmosphere containing any element of group IIIb, group IVb, group Vb, group VIb or group VIIb.

The method of forming the growth nucleus layer is not limited thereto, but the growth nucleus layer may be formed by injecting ions of such an element with acceleration into the surface of the substrate layer.

Besides, a case that ITO is principally used as the material of the transparent conductive film has been explained in the embodiments described above, but it can also be aimed at optimization of selective growth by making an element of group IIIb, group IVb, group Vb, group VIb or group VIIb stick to the surface when an oxide transparent conductive material composed of at least one element among elements in group IIb, group IIIb and group IVb (IUPAC, provisional declaration in 1972) such as $In_2O_3$, $SnO_2$ and $ZnO$ is used. Moreover, the reducing operation is controlled by sticking an element of group Vb to the surface thereof.

Further, silicon has been grown selectively in the above-mentioned embodiments, but germanium is also applicable.

What is claimed is:

1. A method of manufacturing a semiconductor device comprising the steps of:
   forming a conductive film on an insulating film;
   forming growth nucleuses (nuclei) on the surface of said conductive film, the growth nucleuses (nuclei) containing one of element of group IIIb, group IVb, group Vb and group VIIb at least that does not constitute said conductive film and said insulating film; and
   growing a semiconductor film selectively on said growth nucleuses (nuclei).

2. A method of manufacturing a semiconductor device according to claim 1, wherein said semiconductor film is grown selectively on said growth nucleuses by repeating growth and etching of a semiconductor at least once.

3. A method of manufacturing a semiconductor device according to claim 1, wherein said conductive film is formed by growing any of a metal, a metallic oxide, a silicon intermetallic compound and a germanium intermetallic compound.

4. A method of manufacturing a semiconductor device according to claim 3, wherein said metal is chrome.

5. A method of manufacturing a semiconductor device according to claim 3, wherein said metallic oxide is any of an indium oxide, a tin oxide and a zinc oxide.

6. A method of manufacturing a semiconductor device according to claim 3, wherein said silicon intermetallic compound is silicide.

7. A method of manufacturing a semiconductor device according to claim 1, wherein said insulating film is a silicon oxide containing film.

8. A method of manufacturing a semiconductor device according to claim 1, wherein said semiconductor film is silicon or germanium.

9. A method of manufacturing a semiconductor device according to claim 1, wherein said growth nucleuses are formed by growing a material having a wider energy band gap than that of the material constituting said conductive film.

10. A method of manufacturing a semiconductor device according to claim 1, wherein said growth nucleuses are formed by having said element stick to the surface of said conductive film by exposing said conductive film to the active atmosphere containing said element.

11. A method of manufacturing a semiconductor device according to claim 10, wherein said active atmosphere is excited by any of plasma discharge, light radiation, gas heating and substrate heating in the low pressure atmosphere.

12. A method of manufacturing a semiconductor device according to claim 10, wherein said conductive film is formed by growing an oxide transparent conductive material at the temperature of 200° C. or below in said active atmosphere.

13. A method of manufacturing a semiconductor device according to claim 10, wherein at least one of nitrogen, ammonium and phosphine is introduced into said active atmosphere.

14. A method of manufacturing a semiconductor device according to claim 1, wherein said growth nucleuses are formed by growing any one of a semiconductor in groups III–V, a semiconductor in groups II–VI, a semiconductor intermetallic compound and a metallic oxide on said conductive film.

15. A method of manufacturing a semiconductor device according to claim 1, wherein said growth nucleuses are formed by removing only at least one type of element among a plurality of elements constituting said conductive film.

16. A method of manufacturing a semiconductor device according to claim 1, wherein said growth nucleuses are formed by having any of said elements in group IIIb, group IVb, group Vb and group VIIb contained in the growth atmosphere when said conductive film is grown.

17. A method of manufacturing a semiconductor device according to claim 16, wherein said conductive film is formed by growing chrome and said growth nucleuses are formed by introducing oxygen at the same time immediately before the growth of chrome is terminated.

18. A method of manufacturing a semiconductor device according to claim 1, wherein said growth nucleuses are formed by means of ion implantation of any of said elements in group IIIb, group IVb, group Vb and group VIIb into said conductive film.

* * * * *